United States Patent
Guan

(10) Patent No.: US 8,059,401 B2
(45) Date of Patent: Nov. 15, 2011

(54) ELECTRONIC DEVICE WITH HEAT DISSIPATION MODULE

(75) Inventor: Zhi-Bin Guan, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 115 days.

(21) Appl. No.: 12/689,190

(22) Filed: Jan. 18, 2010

(65) Prior Publication Data

US 2011/0122578 A1    May 26, 2011

(30) Foreign Application Priority Data

Nov. 26, 2009    (TW) .............................. 98140446 A

(51) Int. Cl.
*H05K 7/20*    (2006.01)
*G06F 1/20*    (2006.01)

(52) U.S. Cl. .................. 361/692; 361/679.54; 361/690; 361/703; 361/704; 361/709; 361/719; 454/184

(58) Field of Classification Search ............. 361/679.46, 361/679.48, 679.54, 690, 692, 694–695, 361/697, 703–704, 709, 719; 454/184

See application file for complete search history.

(56) References Cited

U.S. PATENT DOCUMENTS

| | | | | |
|---|---|---|---|---|
| 6,094,345 A | * | 7/2000 | Diemunsch | 361/695 |
| 6,113,485 A | * | 9/2000 | Marquis et al. | 454/184 |
| 6,940,716 B1 | * | 9/2005 | Korinsky et al. | 361/695 |
| 7,265,984 B2 | * | 9/2007 | Numata | 361/719 |
| 7,652,882 B2 | * | 1/2010 | Korinsky et al. | 361/695 |
| 7,724,526 B2 | * | 5/2010 | Hinze et al. | 361/704 |
| 2003/0210524 A1 | * | 11/2003 | Berg et al. | 361/687 |
| 2006/0023419 A1 | * | 2/2006 | Kao et al. | 361/690 |
| 2006/0187643 A1 | * | 8/2006 | Tsurufusa | 361/704 |

FOREIGN PATENT DOCUMENTS

JP    2006326102 A * 12/2006 ........................ 5/4 A

* cited by examiner

*Primary Examiner* — Robert J Hoffberg
(74) *Attorney, Agent, or Firm* — Altis Law Group, Inc.

(57) ABSTRACT

An electronic device includes a printed circuit board and a heat dissipation module. The printed circuit board has a first heat-generating electronic component and a number of second heat-generating electronic components. The heat dissipation module includes a heat sink thermally engaging on the first heat-generating electronic component and an enclosure enclosing the printed circuit board. The heat sink includes a number of fins. The enclosure extends an inner casing to envelop the fins of the heat sink. The enclosure defines a number of slots letting the casing communicate with an exterior of the enclosure. The casing separates the fins from the second heat-generating electronic component.

12 Claims, 4 Drawing Sheets

ELECTRONIC DEVICE WITH HEAT DISSIPATION MODULE

BACKGROUND

1. Technical Field

The present disclosure generally relates to electronic devices and, more particularly, to an electronic device having a heat dissipation module for cooling the electronic components installed in the device.

2. Description of Related Art

The primary heat-generating electronic component, such as the central processing unit (CPU) mounted on a motherboard in an electronic device, produces a lot of heat during operation. The heat must be quickly carried away. Excessively high temperature causes the CPU to work abnormally. In addition to the CPU, other electronic components such as integrated circuits (ICs) or metal oxide semiconductor field effect transistors (MOSFETs) near to the CPU are also sources of heat. With the development of ever more compact devices, heat dissipation in limited space becomes more difficult.

Thus, it is desirable to devise a heat dissipation module, which can dissipate heat generated in a limited space environment effectively.

DETAILED DESCRIPTION

Figure 1:
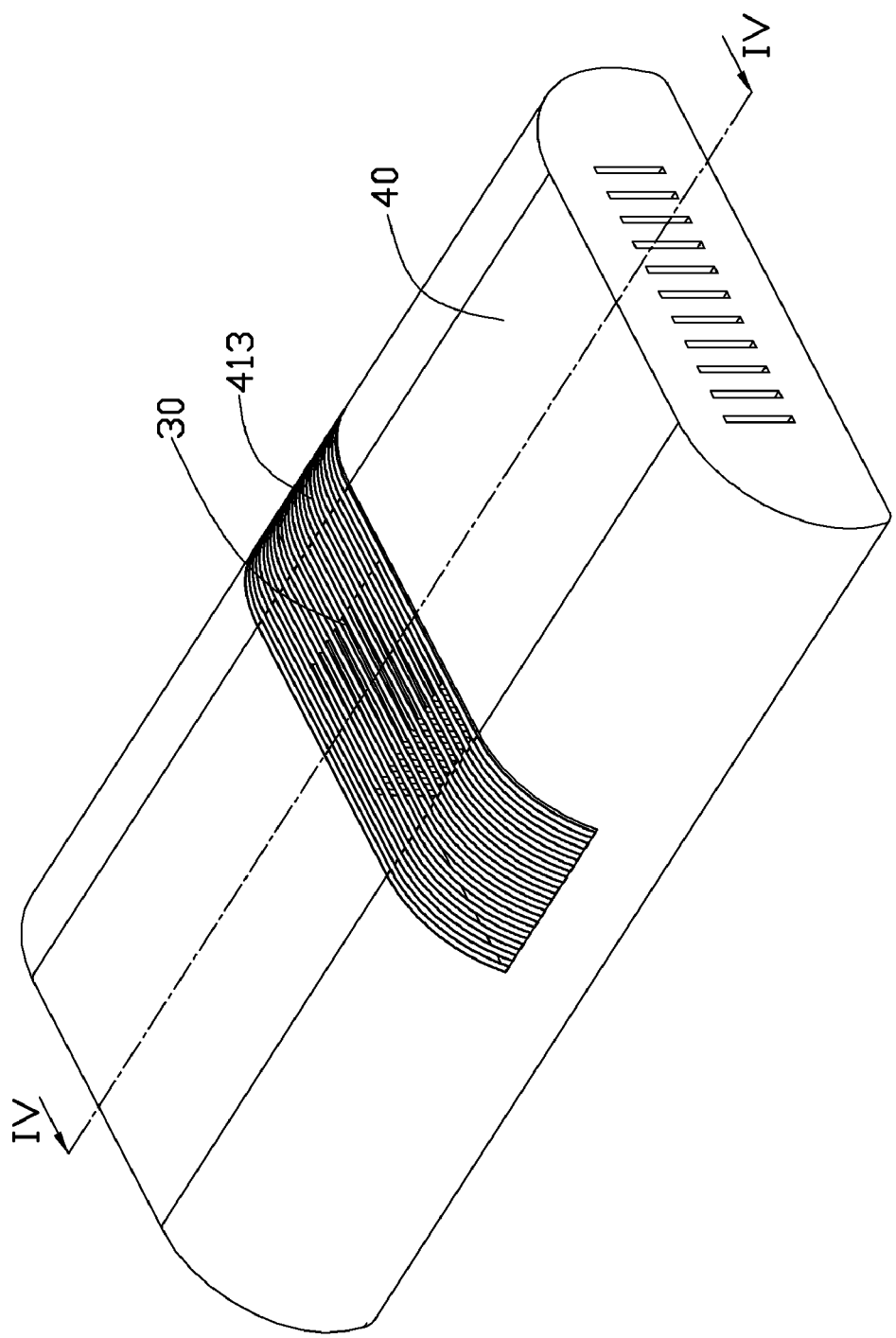
FIG. 1 is an assembled view of an electronic device with a heat dissipation module in accordance with an embodiment of the present disclosure.
Figure 2:
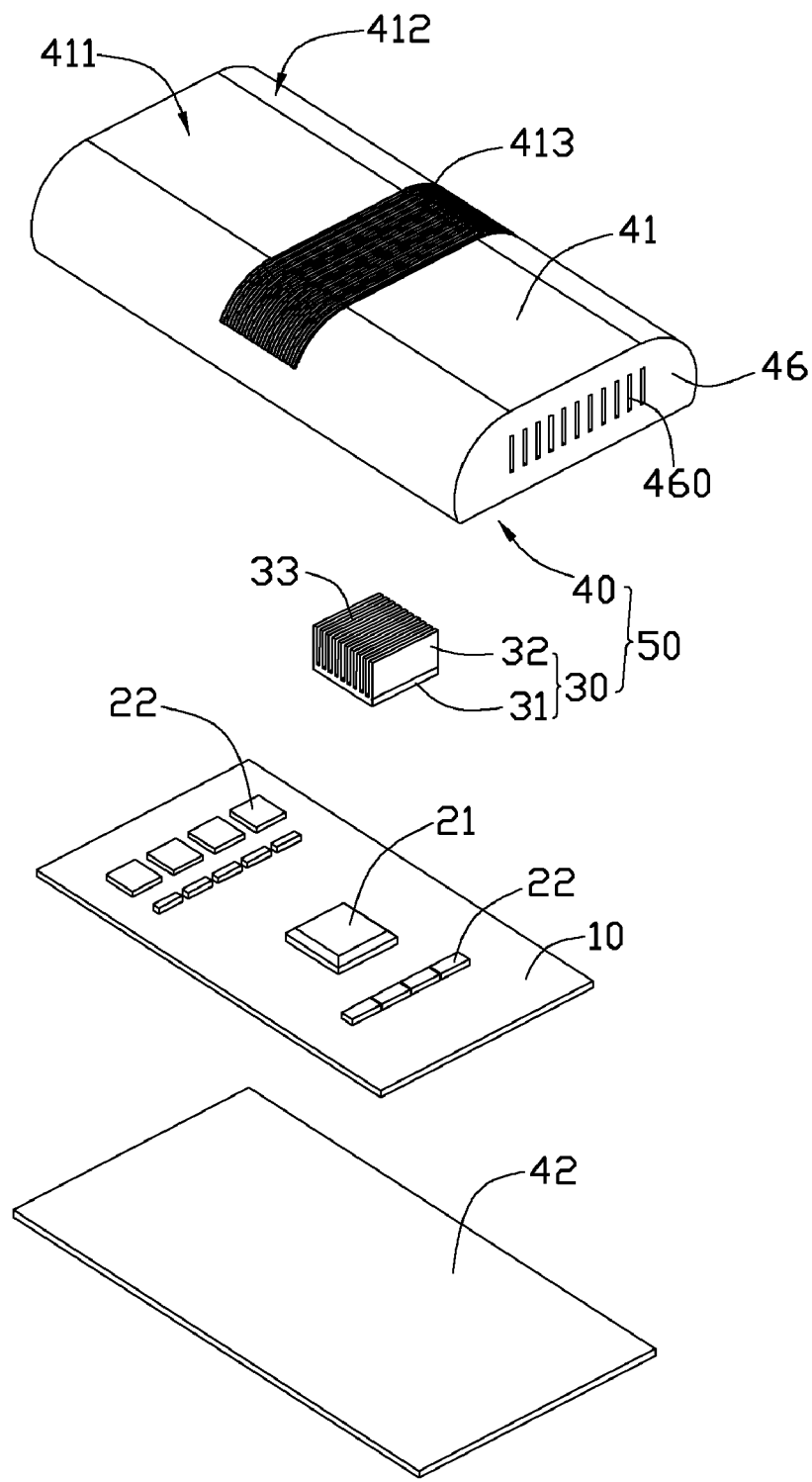
FIG. 2 is an exploded view of the electronic device of FIG. 1.
Figure 3:
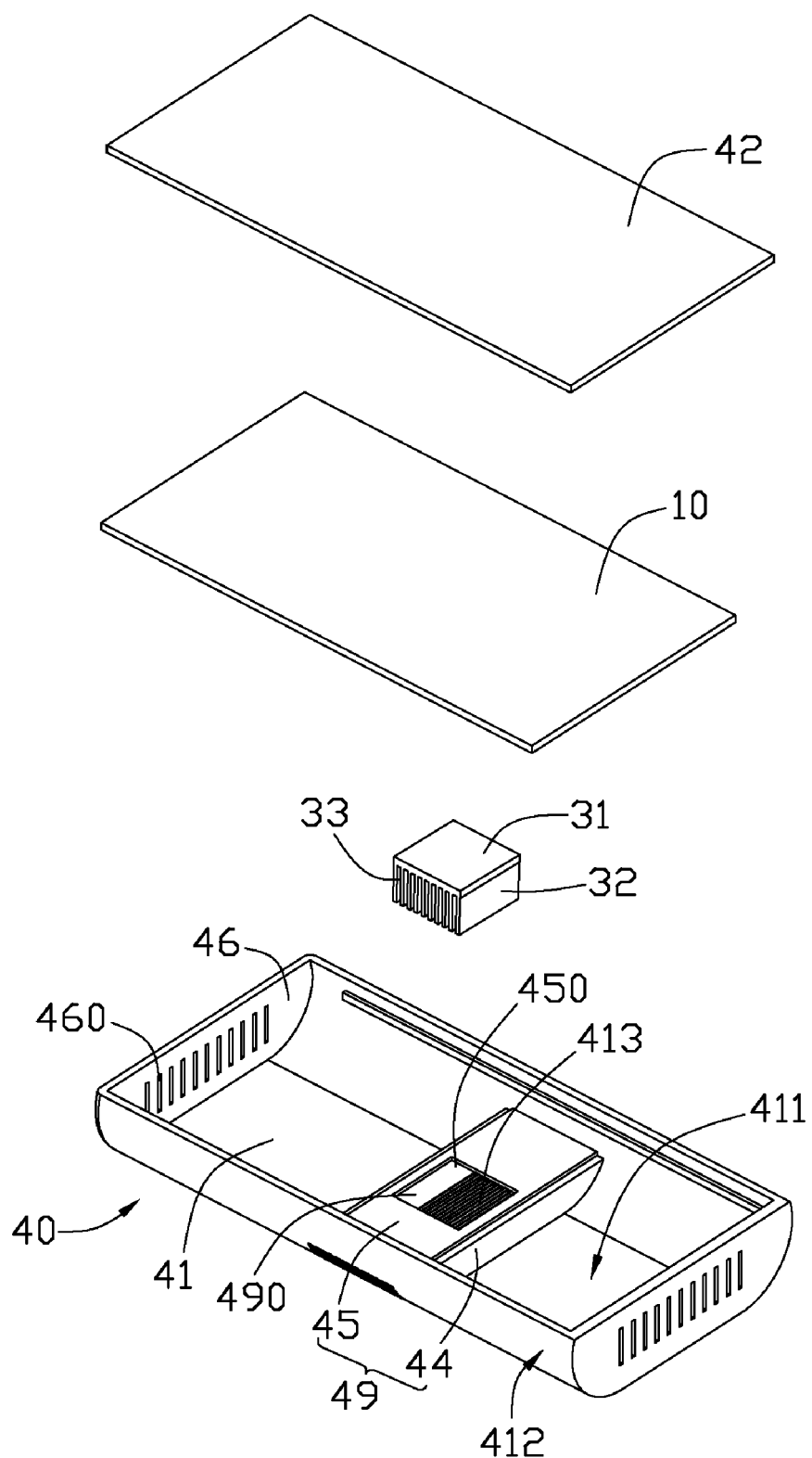
FIG. 3 is an inverted view of the electronic device of FIG. 2.

Referring to FIGS. 1-3, an electronic device in accordance with a first embodiment of the disclosure is illustrated. The electronic device comprises an elongated printed circuit board (PCB) 10 and a heat dissipation module 50 enclosing the PCB 10. The PCB 10 comprises a primary heat-generating electronic component 21 and a plurality of subordinate heat-generating electronic components 22. The heat dissipation module 50 comprises a heat sink 30 attached to the primary component 21, and an enclosure 40 enclosing the PCB 10 and the heat sink 30.

The PCB 10 extends lengthways. The primary component 21 is disposed on a central portion of the PCB 10, and the subordinate components 22 are mounted on two ends of the PCB 10. In this embodiment, the electronic device is a game player, the primary component 21 is a central processing unit (CPU), and subordinate components 22 are other ICs generating less heat than that generated by the primary component 21.

The heat sink 30 comprises a substrate 31 and a number of fins 32 extending from a top of the substrate 31. The fins 32 are parallel to and spaced from each other thereby defining a number of airflow channels 33 therebetween. The channels 33 are defined through two sides and a top of the heat sink 30. When the heat sink 30 is mounted on the primary component 21, the channels 33 are defined transversely facing the lateral sides of the PCB 10.

Figure 4:
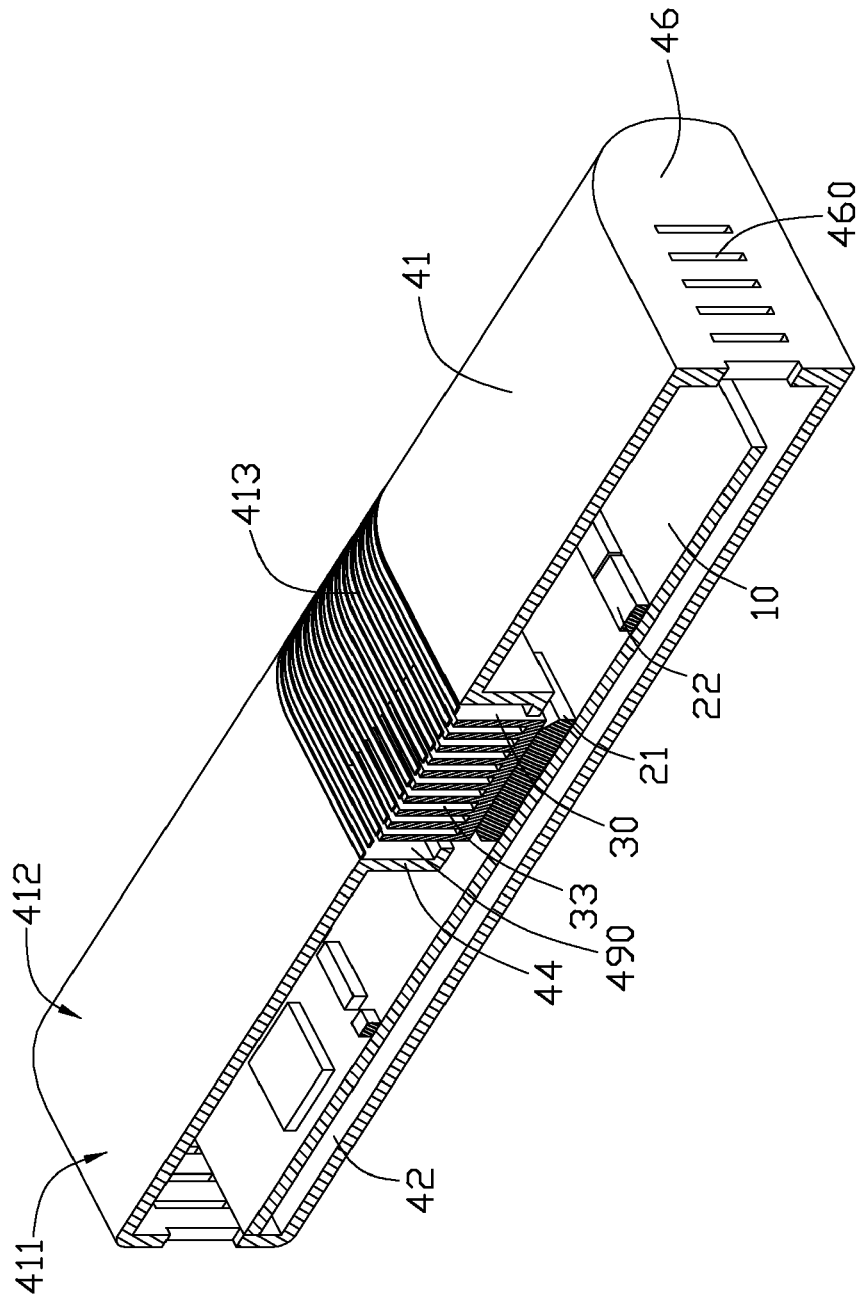
FIG. 4 is a sectional view of the electronic device, taken along the line IV-IV of FIG. 1.

Referring also to FIG. 4, the enclosure 40 comprises an elongated cover 41 and a base 42 engaged with the elongated cover 41. The PCB 10 is mounted between the base 42 and the cover 41, and the fins 32 of the heat sink 30 extends upwardly and toward to the cover 41. The cover 41 has a U-shaped cross section. The cover 41 has a flat surface 411 and two curved surfaces 412 at two lateral sides of the flat surface 411. The cover 41 defines an intake communicating the enclosure 40 with an exterior of the enclosure. In this embodiment, the intake is a plurality of parallel slots 413. Each of the slots 413 transversely passes through the top surface 411 and parts of the curved surface 412. The slots 413 correspond to the primary component 21 and the heat sink 30, thereby communicating the channels 33 of the heat sink 30 with the exterior. In this embodiment, the slots 413 are parallel to and above the channels 33 of the heat sink 30. The cover 41 further comprises two vertical walls 46 at two ends of the enclosure 40. Each of the walls 46 connects lateral edges of the cover 41 and the base 42. Each of the walls 46 defines a plurality of vertical narrow slits 460 to let the enclosed space defined by the enclosure 40 communicate with the exterior.

The enclosure 40 further comprises an inner casing 49 downwards extending from the cover 41 to envelop the fins 32. The casing 49 comprises two partitions 44 extending down from bottom surface of the cover 41 and a bottom plate 45 connecting the two partitions 44. The two partitions 44 each extend from one of the two curved surfaces 412 of the cover 41 to the other. The partitions 44 are located at two sides of the slots 413 and sandwiching the fins 32 of the heat sink 30. The bottom plate 45 comprises two ends each extending from one of the two curved surfaces 412 to the other. The bottom plate 45 defines an opening 450 at a center thereof for extension of the fins 32 therethrough. The casing 49 defines a receiving room 490 to receive the fins 32 and separate the fins 32 from the subordinate components 22. The receiving room of the casing 49 communicates with the exterior via the slots 413.

When the electronic device works, heat generated by the primary component 21 is absorbed by the substrate 31 of the heat sink 30 and transferred to the fins 32. Heat of the fins 32 is dissipated to the exterior of the of the enclosure 40 via the slots 413 of the cover 41. The heat generated by the primary component 21 is directly transferred to the exterior via the slots 413 of the cover 41. Heat generated by the subordinate components 22 can be dissipated to the exterior via the slits 460 of the walls 46. Therefore, the heat generated by the primary component 21 and the subordinate components 22 is dissipated out of the enclosure 40 in different way to avoid a too high temperature of an inner of the electronic device and to avoid heat from the primary component 21 to reach and heat up the subordinate components 22.

It is to be understood, however, that even though numerous characteristics and advantages of various embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic device comprising:
  a printed circuit board having a first heat-generating electronic component and at least one second heat-generating electronic component spaced from the first heat-generating electronic component; and a heat dissipation module enclosing the printed circuit board, the heat dissipation module comprising:
a heat sink thermally engaging on the first heat-generating electronic component, the heat sink comprising a plurality of fins; and
an enclosure enclosing the printed circuit board, the enclosure comprises a cover and a base, an interior side of the cover defining an inner casing enveloping the plurality of fins of the heat sink, the cover defining an intake above the heat sink and the inner casing communicating with an exterior of the enclosure via the intake, the cover comprises two side walls connecting the base to the cover, each of the two side walls defines a plurality of slits letting the at least one second heat-generating electronic component communicate with the exterior of the enclosure;
wherein the inner casing separates the plurality of fins from the at least one second heat-generating electronic component.

2. The electronic device of claim 1, wherein the intake is a plurality of slots defined in the enclosure.

3. The electronic device of claim 2, wherein the plurality of fins are parallel to each other to define a number of airflow channels, the airflow channels communicating with the exterior of the enclosure via the slots.

4. The electronic device of claim 3, wherein the airflow channels of the plurality of fins are parallel to the slots.

5. The electronic device of claim 3, wherein the slots are defined above the airflow channels of the heat sink.

6. The electronic device of claim 1, wherein the inner casing comprises two partitions sandwiching the plurality of fins and a bottom plate connecting the two partitions.

7. The electronic device of claim 6, wherein the bottom plate defines an opening for an extension of the plurality of fins, the two partitions and the bottom plate together defining a receiving room of the inner casing to receive the plurality of fins.

8. The electronic device of claim 1, wherein the inner casing extends downward from the cover and under the intake.

9. A heat dissipation module adapted to dissipate heat generated by electronic components mounted on a printed circuit board, comprising:
a heat sink for engaging on one of the electronic components; and
an enclosure for enclosing the printed circuit board and the heat sink, the enclosure comprises a cover and a base, an interior side of the cover defining an inner casing enveloping the heat sink, the cover defining a plurality of slots above the heat sink, the plurality of slots letting the inner casing communicate with an exterior of the enclosure, the cover comprises two side walls connecting the base to the cover, each of the two side walls defines a plurality of slits letting another of the electronic components communicate with the exterior of the enclosure;
wherein the inner casing separates the heat sink from a space for the another of the electronic components outside the inner casing in the enclosure.

10. The heat dissipation module of claim 9, wherein the inner casing extends downward from the cover and under the slots.

11. The heat dissipation module of claim 9, wherein the inner casing comprises two partitions sandwiching the heat sink and a bottom plate connecting the two partitions.

12. The heat dissipation module of claim 11, wherein the bottom plate defines an opening for the heat sink to extend therethru, the two partitions and the bottom plate together defining a receiving room to receive the heat sink.

* * * * *